United States Patent [19]

Adams

[11] Patent Number: 4,817,191
[45] Date of Patent: Mar. 28, 1989

[54] RADIO AND COOLER

[76] Inventor: Timothy J. Adams, 64 Laurie Dr., Novato, Calif. 94947

[21] Appl. No.: 86,370

[22] Filed: Aug. 17, 1987

[51] Int. Cl.$^4$ .................... H04B 1/06; H04B 1/08; H05K 11/00

[52] U.S. Cl. .................... 455/351; 455/344; 455/347

[58] Field of Search ............ 455/344, 347, 351, 346; 62/457, 463

[56] References Cited

U.S. PATENT DOCUMENTS

| | | | |
|---|---|---|---|
| 4,019,340 | 4/1977 | Conklin | 62/457 |
| 4,571,740 | 2/1986 | Kirby et al. | 455/344 |
| 4,700,395 | 10/1987 | Long | 381/90 |

Primary Examiner—John Chapman
Assistant Examiner—Brent Bonner
Attorney, Agent, or Firm—Larry D. Johnson

[57] ABSTRACT

An improved radio and cooler incorporates a radio receiver unit into an indentation in the front wall of a four-walled, portable insulated cooler or ice chest. A separate rechargeable battery pack, connected by wires to the radio receiver unit, is integrated into the rear side of the lid of the cooler, on the opposite side of the cooler's center of gravity from the radio receiver unit, and thus acts as a counterbalance to the radio and improves the overall balance of the cooler. In addition, the radio's antenna is similarly positioned opposite the center of gravity from the radio receiver unit, on the upper rear side of the cooler lid, further enhancing the counterbalancing effect.

3 Claims, 2 Drawing Sheets

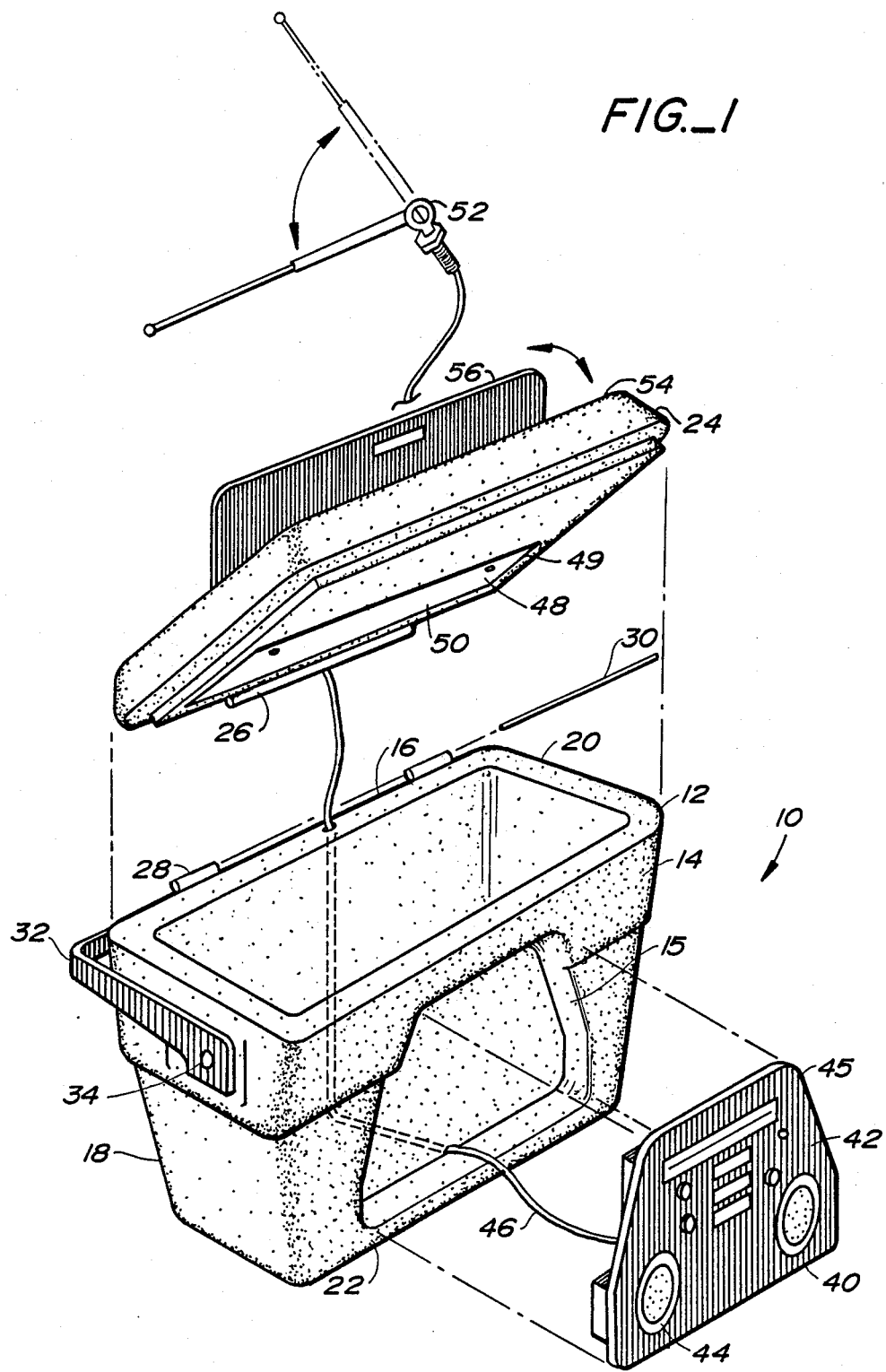
FIG._1

FIG._2
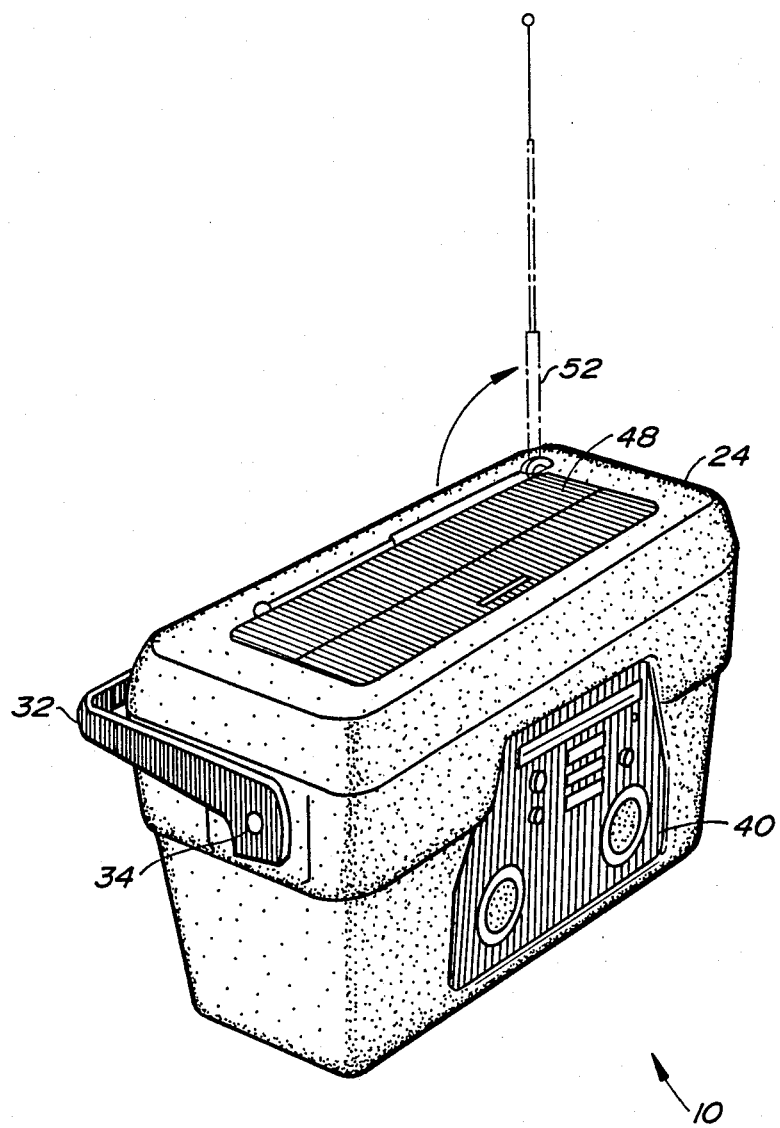

RADIO AND COOLER

BACKGROUND OF THE INVENTION

1. Field of the Invention

This invention relates generally to containers for food and beverages, and more specifically to an improved insulated cooler and radio device.

2. Description of the Prior Art

Insulated coolers and ice chests are well known, commonly-used articles used to carry food and beverages for leisure activities, as well as in the workplace. Most such ice chests are box-like structures made with foam or foam-filled walls, and have a removable or hinged lid to permit access to the inside. It is often desirable to additionally have a radio receiver or cassette player available for the leisure or work activities where an ice chest is used. Accordingly, some ice chest have recently been manufactured with an integral radio built in, typically into the front wall or surface of the ice chest. However, because of the relatively greater density of the radio components over the foam insulation that is displaced, this type of arrangement results in an off-balanced chest, which can be difficult or awkward to carry. In addition, replacement of the radio's batteries may be difficult with this kind of structure.

SUMMARY OF THE INVENTION

The radio and cooler of this invention incorporates a radio receiver unit into an indentation in the front wall of a four-walled, portable insulated cooler or ice chest. A separate rechargeable battery pack, connected by wires to the radio receiver unit, is integrated into the rear side of the cover or lid of the cooler, on the opposite side of the cooler's center of gravity from the radio receiver unit, and thus acts as a counterbalance to the radio and improves the overall balance of the cooler. The batteries are placed within a watertight compartment in the lid, and thus are readily accessible for replacement or recharging when necessary. In addition, the radio's antenna is similarly positioned opposite the center of gravity from the radio receiver unit, on the upper rear side of the cooler lid, further enhancing the counterbalancing effect. The front portion of the lid, next to the battery compartment, can be an accessory compartment accessible by a separate lid opening to the outside of the cooler.

BRIEF DESCRIPTION OF THE DRAWINGS

FIG. 1 is an exploded perspective view of a radio and cooler of this invention in its open configuration, illustrating the assembly and distribution of the various components throughout the unit; and FIG. 2 is a perspective view of a radio and cooler of this invention 1 in its closed configuration.

DETAILED DESCRIPTION OF A PREFERRED EMBODIMENT

FIG. 1 is an exploded perspective view of a radio and cooler 10 of this invention in its open configuration, illustrating the assembly and distribution of the various components throughout the unit. Radio and cooler 10 comprises an insulated container member 12 having a front wall 14, rear wall 16, left wall 18, right wall 20, and base 22. Each of these walls includes an inner and outer surface made of plastic, aluminum, or other suitable material, and is filled with foam or other insulating agent. A cooler lid 24 is attached to container 12 by a lid hinge 26 and container hinge 28, through which a hinge pin 30 is extended. Construction of the hinge in this two-part manner is desirable in that it enables ready manufacture of the parts by plastic molding techniques. A carrying handle 32 is attached to container walls 18, 20, and pivots about shaft 34 to enable access to the lid 24 when desired.

A radio receiver or radio/cassette unit 40 is constructed as a one-piece unit with a receiver 42 and a pair of speakers 44 collected behind a face plate 45. The entire radio receiver unit is placed within a molded indentation 15 in container member front wall 14, so that face plate 45 becomes generally flush and coplanar with the front surface of front wall 14. Power/antenna wire 46 is routed through front wall 14, base 22, and rear wall 16, and passes adjacent hinges 26, 28 up and into lid 24. The power portion of power/antenna wire 46 is connectable to a rechargeable battery pack or unit 48 which is positioned in battery compartment 49 in the rear portion of lid 24, behind a removable waterproof cover 50. The antenna portion of power/antenna wire 46 extends to adjustable telescoping antenna 52, similarly situated on the rear portion of lid 24. An accessory or carry-all compartment 54 is incorporated into the front portion of lid 24, beneath an accessory compartment lid 56.

Referring now to FIG. 2 with greater particularity, a perspective view of the radio and cooler 10 of this invention is shown in its closed configuration. In this view, it can be appreciated that the weight of radio unit 40 is effectively counterbalanced by placement of the relatively weighty battery pack 48 and antenna 52 in the rear of lid 24, thereby maintaining the center of gravity of the overall radio and cooler 10 near the shaft 34 of the handle 32.

While this invention has been described in connection with preferred embodiments thereof, it is obvious that modifications and changes therein may be made by those skilled in the art to which it pertains without departing from the spirit and scope of the invention. Accordingly, the scope of this invention is to be limited only by the appended claims.

What is claimed as invention is:

1. An insulated container apparatus comprising:
   an insulated container member having front wall, rear wall, right wall, left wall and base portions, said front wall having a front surface, and said front surface having an indentation;
   a container lid member having a front portion and a rear portion, said rear portion comprising a watertight compartment;
   hinge means hingedly connecting said lid rear portion to said container rear wall;
   audio means for playing amplified music or speech, said audio means attached to said container member within said indentation in said front surface;
   battery means comprising a rechargeable battery unit for powering said audio means, said battery means within said lid member rear portion watertight compartment; and
   antenna means for receiving broadcast signals for said audio means, said antenna means attached to said lid member rear portion.

2. The insulated container apparatus of claim 1 including a handle means attached to said insulated container right wall and left wall.

3. The insulated container apparatus of claim 2 wherein said storage lid member front portion comprises an accessory storage compartment.

* * * * *